(12) United States Patent  
Sonobe et al.

(10) Patent No.: US 8,358,674 B2  
(45) Date of Patent: Jan. 22, 2013

(54) SEMICONDUCTOR LASER ELEMENT AND METHOD OF MANUFACTURING THEREOF

(75) Inventors: Shinya Sonobe, Anan (JP); Shingo Masui, Tokushima (JP); Takashi Miyoshi, Anan (JP)

(73) Assignee: Nichia Corporation, Anan-shi (JP)

( * ) Notice: Subject to any disclaimer, the term of this patent is extended or adjusted under 35 U.S.C. 154(b) by 101 days.

(21) Appl. No.: 13/051,805

(22) Filed: Mar. 18, 2011

(65) Prior Publication Data

US 2011/0235666 A1    Sep. 29, 2011

(30) Foreign Application Priority Data

Mar. 25, 2010  (JP) ................................. 2010-069021  
Mar. 15, 2011  (JP) ................................. 2011-056239

(51) Int. Cl.  
*H01S 5/00* (2006.01)

(52) U.S. Cl. .............. 372/45.011; 372/44.01; 372/43.01

(58) Field of Classification Search ............. 372/45.011, 372/44.01, 43.01  
See application file for complete search history.

(56) References Cited

U.S. PATENT DOCUMENTS

| | | | |
|---|---|---|---|
| 2005/0030999 A1 * | 2/2005 | Yoneda ............................ | 372/46 |
| 2005/0279994 A1 * | 12/2005 | Ueda et al. ...................... | 257/33 |
| 2006/0091417 A1 * | 5/2006 | Sugimoto et al. ................ | 257/99 |
| 2008/0008220 A1 | 1/2008 | Ueda et al. | |

FOREIGN PATENT DOCUMENTS

| | | |
|---|---|---|
| JP | H09-074249 A | 3/1997 |
| JP | 2006-041491 A | 2/2006 |

OTHER PUBLICATIONS

Chia-Sheng Chang et al., "InGaN/GaN Light-Emitting Diodes with Rapidly Thermal-Annealed Ni/ITO p—Contracts", Jpn. J. Appl. Phys. vol. 42 (2003) pp. 3324-3327.

* cited by examiner

*Primary Examiner* — Kinam Park  
(74) *Attorney, Agent, or Firm* — Global IP Counselors, LLP

(57) ABSTRACT

A semiconductor laser element having; a substrate, a semiconductor layer laminated a first conductivity type semiconductor layer, an active layer and a second conductivity type semiconductor layer in that order on the substrate, a stripe-like ridge formed on the upper face of the second conductivity type semiconductor layer, a conductive oxide layer formed on the upper face of the ridge, a dielectric layer, with a refractive index that is lower than the refractive index of the semiconductor layer, formed on the side faces of the ridge, and a metal layer formed so as to cover the conductive oxide layer and the dielectric layer, the surface of the conductive oxide layer is exposed from the dielectric layer, and the side faces of the conductive oxide layer are sloped with respect to the upper face of the ridge, and the inclination angle of the side faces of the conductive oxide layer with respect to the normal direction is greater than the inclination angle of the side faces of the ridge with respect to the normal direction.

9 Claims, 6 Drawing Sheets

SEMICONDUCTOR LASER ELEMENT AND METHOD OF MANUFACTURING THEREOF

CROSS-REFERENCE TO RELATED APPLICATIONS

This application claims priority to Japanese Patent Application No. 2010-69021 and 2011-56239 filed on Mar. 25, 2010 and Mar. 15, 2011, respectively. The entire disclosure of Japanese Patent Application No. 2010-69021 and 2011-56239 is hereby incorporated herein by reference.

BACKGROUND

1. Technical Field

The present invention relates to a semiconductor laser element and to a method for manufacturing the same, and more particularly relates to a semiconductor laser element having a conductive oxide layer, and to a method for manufacturing the same.

2. Related Art

Conductive oxide layers have been widely used in the past as electrodes in semiconductor light emitting elements, and particularly in light emitting diodes (LEDs). (See Chia-Sheng CHANG et. al, "InGaN/GaN Light-Emitting Diodes with Rapidly Thermal-Annealed Ni/ITO p-Contacts", Jpn. J. Appl. Phys. vol. 42 (2003) pp. 3324-3327)

Advantages to a semiconductor laser element are that the conductive oxide layer does not absorb much light, the refractive index is low, and so forth, so a technique has been proposed in which a conductive oxide layer having a refractive index lower than the refractive index of the light emitting layer is formed on a semiconductor layer having a ridge shape, with this conductive oxide layer functioning both as a conductive electrode and a clad layer. (See Patent Literature 1: JP H09-74249-A)

In addition, a technique has been proposed in which a block layer having a stripe-shaped opening is disposed on a semiconductor layer laminate, and a conductive oxide layer is formed on the block layer including this opening, the result being a clad layer electrode equipped with a ridge-shaped protrusion, having the function of both a conductive electrode and a clad layer. (See Patent Literature 2: JP2006-41491-A)

With these semiconductor laser elements, a dielectric layer is usually formed on the side faces of the ridge in order to ensure an effective refractive index distribution in the waveguide region directly below the ridge and the regions directly below both sides of this ridge.

An example of the method for forming the dielectric layer on the side faces of the ridge is a method in which a dielectric layer is formed from the bottom face region of the ridge all the way to a region that reaches the electrode, and etching this dielectric layer using a resist, thereby leaving the dielectric layer on the ridge side faces while removing the dielectric layer from the place where it contacts the electrode.

However, the above-mentioned elements have yet to see practical application because the high resistivity of conductive oxides drives up the voltage, and the electrical characteristics are unsatisfactory. These problems are particularly pronounced when using a current confined path structure because the current density rises in the narrower emission region.

Also, it was difficult with the above-mentioned method for forming a dielectric layer to precisely leave the dielectric layer only on the side faces of the ridge.

In particular, with the semiconductor laser element in Patent Literature 1, the side faces of the conductive oxide layer and the semiconductor layer lie in the same plane, so it is difficult to stop the etching precisely at the boundary between the conductive oxide layer and the semiconductor layer.

Therefore, when there is a region of the ridge side faces that is not covered by the dielectric layer, proper optical confinement becomes impossible, and leakage is caused when the electrode contacts the ridge side face, among other such problems.

Meanwhile, when the dielectric layer is left on the side faces of the conductive oxide layer, the problem with this is that the voltage is raised and the performance of the semiconductor laser element cannot be fully realized.

SUMMARY

The present invention was conceived in light of the above problems, and it is an object thereof to provide a semiconductor laser element featuring a conductive oxide, with which electrical characteristics are improved, thereby increasing power efficiency and affording greater reliability, as well as a method for manufacturing this semiconductor laser element.

A semiconductor laser element of the present invention has;
a substrate,
a semiconductor layer laminated a first conductivity type semiconductor layer, an active layer and a second conductivity type semiconductor layer in that order on the substrate,
a stripe-like ridge formed on the upper face of the second conductivity type semiconductor layer,
a conductive oxide layer formed on the upper face of the ridge,
a dielectric layer, with a refractive index that is lower than the refractive index of the semiconductor layer, formed on the side faces of the ridge, and
a metal layer formed so as to cover the conductive oxide layer and the dielectric layer,
the surface of the conductive oxide layer is exposed from the dielectric layer, and the side faces of the conductive oxide layer are sloped with respect to the upper face of the ridge, and
the inclination angle of the side faces of the conductive oxide layer with respect to the normal direction is greater than the inclination angle of the side faces of the ridge with respect to the normal direction.

A method for manufacturing the semiconductor laser element has the steps of;
(a) producing a semiconductor layer by laminating the first conductivity type semiconductor layer, the active layer and the second conductivity type semiconductor layer in that order on a substrate, forming a mask layer with a specific shape on the semiconductor layer, and thereafter, forming a ridge by removing a part of the second conductivity type semiconductor layer using the mask layer;
(b) forming a second mask layer at least from the bottom face region on both sides of the ridge to a region reaching above the mask layer on the ridge upper face;
(c) exposing the mask layer from the second mask layer by removing a part of the second mask layer from the ridge;
(d) exposing the ridge upper face by removing the mask layer on the ridge;
(e) forming the conductive oxide layer in which the inclination angle of the side faces thereof with respect to the normal direction of the ridge upper face is greater than the inclination angle of the side faces of the ridge with respect to the normal direction on the ridge upper face;
(f) removing the second mask layer;

(g) forming a dielectric layer on an region which is at least from the ridge bottom face region all the way to the upper face of the conductive oxide layer on the ridge;

(h) removing the dielectric layer from the surface of the conductive oxide layer in a state in which the dielectric layer is left on the side faces of the ridge to expose the surface; and (i) forming a metal layer on the upper face of the conductive oxide layer and the dielectric layer left in process (h), or (A) laminating a first conductivity type semiconductor layer, an active layer, a second conductivity type semiconductor layer and a conductive oxide layer in that order on a substrate;

(B) forming a mask layer in a specific shape on the conductive oxide layer, and patterning the conductive oxide layer whose side faces are sloped by utilizing the mask layer;

(C) forming a ridge in which the inclination angle of the ridge side faces with respect to the normal direction of the ridge upper face is formed smaller than the inclination angle of the conductive oxide layer with respect to the normal line;

(D) forming a dielectric layer on the second conductivity type semiconductor layer including the ridge with the mask layer left in place;

(E) removing the mask layer to expose the surface of the conductive oxide layer on the ridge; and (F) forming a metal layer on at least the upper face of the conductive oxide layer and the dielectric layer.

According to the invention, it is possible to provide a semiconductor laser element featuring a conductive oxide, with which electrical characteristics are improved, thereby increasing significantly power efficiency and affording greater reliability, as well as a method for manufacturing this semiconductor laser element.

DETAILED DESCRIPTION OF THE PREFERRED EMBODIMENTS

Preferred embodiments of the present invention will now be described through reference to the drawings. However, the following embodiments are merely examples of a semiconductor laser element that embodies the technological concept of the invention, and the semiconductor laser element of the present invention is not limited to what follows. Furthermore, members that are the same or similar are given the same names and numbers in the following description, and may not always be described again in detail.

(Semiconductor Laser Element)

Figure 1:
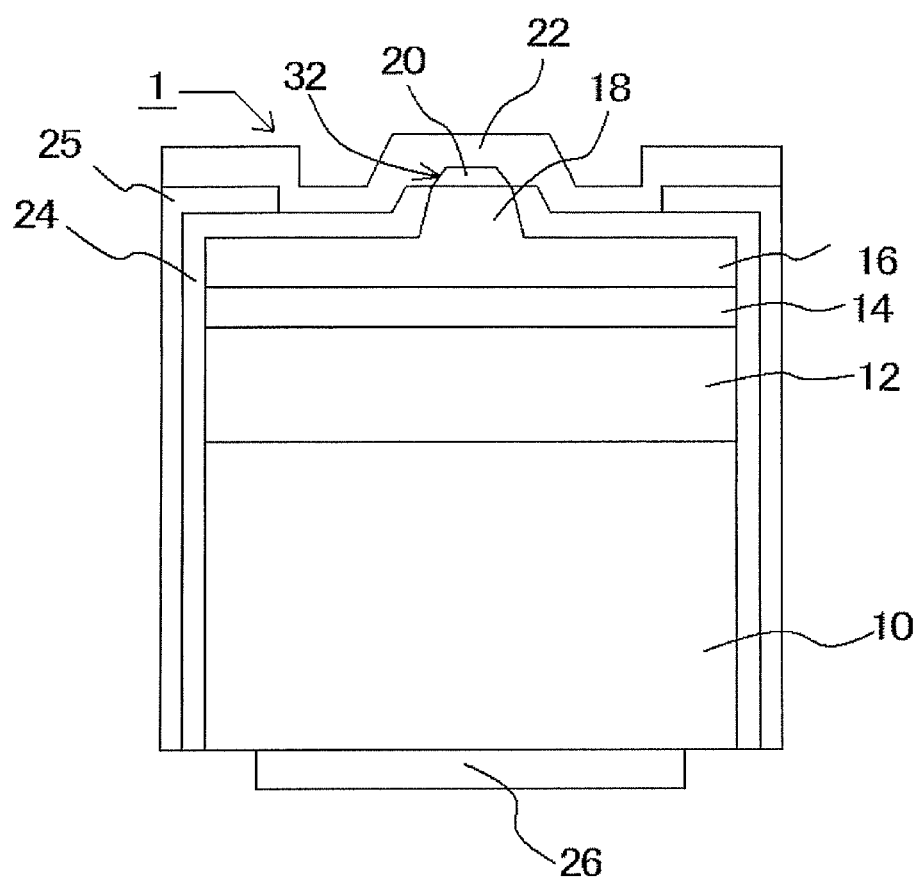
FIG. 1 is a schematic cross sectional view for describing the structure of the semiconductor element according to an embodiment of the present invention.

The semiconductor laser element 1 of the present invention mainly comprises a substrate, a semiconductor layer, an electrode formed by a conductive oxide layer, and a dielectric film. As shown in FIG. 1, this semiconductor laser element is typically produced by laminating a first conductivity type semiconductor layer 12 (such as an n-side semiconductor layer), an active layer 14, and a second conductivity type semiconductor layer 16 (such as a p-side semiconductor layer) in that order on the substrate 10, and forming the conductive oxide layer 20 on the upper face of the second conductivity type semiconductor layer 16.

With the semiconductor laser element shown in FIG. 1, a stripe-like ridge 18 is formed on the upper face of the second conductivity type semiconductor layer 16, and the conductive oxide layer 20 is connected only at the upper face of this ridge 18. In other words, the conductive oxide layer 20 functions as an ohmic electrode.

Figure 3:
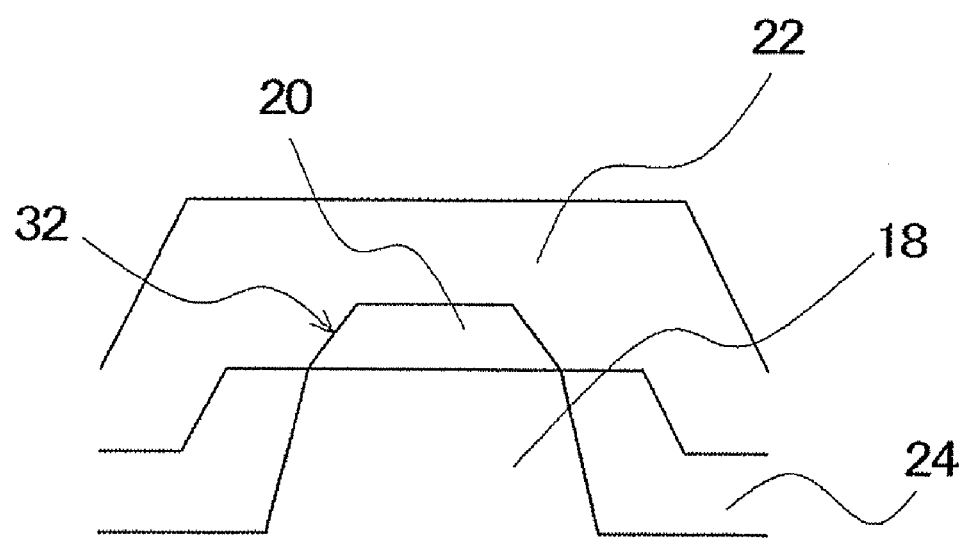
FIG. 3 is a partial enlarge cross sectional view for showing a state of the conductive oxide layer and the dielectric layer according to an embodiment of the present invention.

A dielectric layer 24 with a refractive index that is lower than the refractive index of the semiconductor layer is formed on the side faces of the ridge 18. Also, a metal layer 22 is formed so as to cover the conductive oxide layer 20 and the dielectric layer 24. FIG. 3 is an enlarged detail view of FIG. 1.

(Conductive Oxide Layer)

Figure 2A:
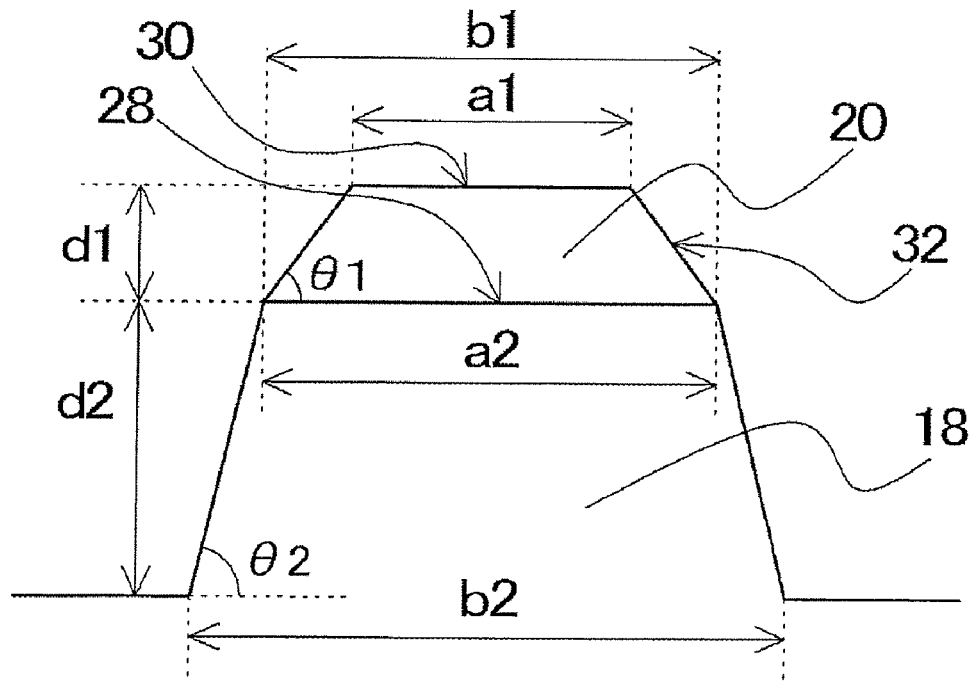
FIG. 2A is a partial enlarge cross sectional view for showing an embodiment of the present invention.
Figure 2B:
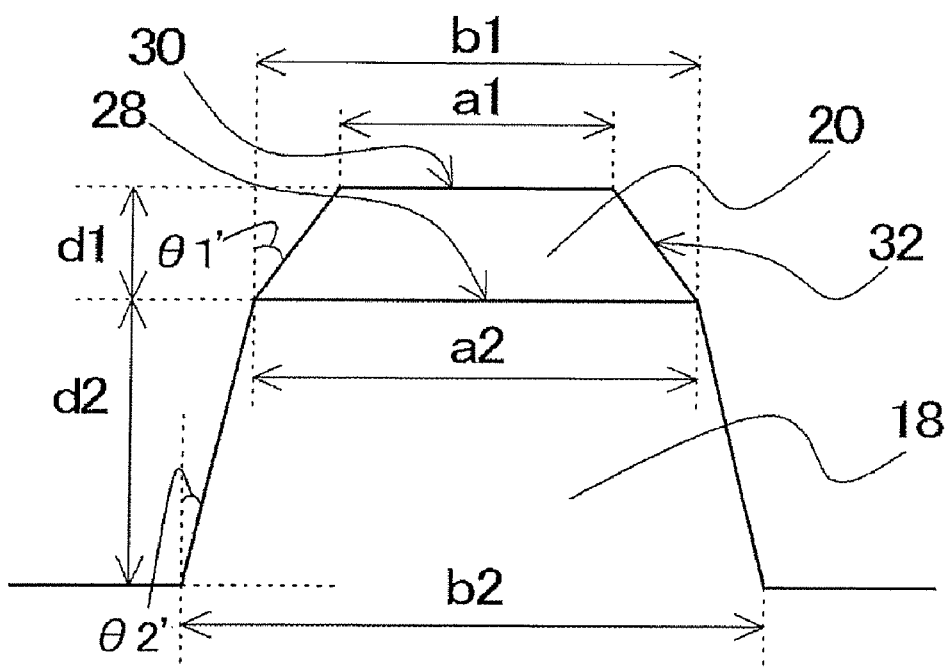
FIG. 2B is a partial enlarge cross sectional view for showing an embodiment of the present invention.

FIGS. 2A and 2B are cross sections of the portion near the ridge, and perpendicular to the stripe direction.

As shown in FIG. 2A, the side faces of the conductive oxide layer 20 are sloped with respect to the upper face 28 of the ridge. In other words, the cross sectional shape of the conductive oxide layer 20 formed on the ridge upper face 28 has an upper face 30 that serves as a flat part in the center of the ridge, and has sloped parts 32 where the film thickness is reduced, from the ends of this upper face toward the ridge side faces. Here, the width a1 of the upper face 30 of the conductive oxide layer is about 1.8 to 25.0 µm, for example. The length of the sloped parts 32 refers to the length from the end of the upper face 30 to the end of the ridge upper face. The length of the sloped parts is suitably adjusted by varying the width b2 of the ridge lower part and the width b1 of the ridge upper face 28, but is preferably between about 0.1 and 3.0 µm. The width of the lower face of the conductive oxide layer 20 shall be termed a2.

The sloped parts 32 of the conductive oxide layer may be formed so as to link the upper face 30 of the conductive oxide layer and the lower face 28 of the conductive oxide layer, and may be formed by a plurality of faces.

In the example shown in FIGS. 2A and 2B, the sloped parts 32 of the conductive oxide layer have sloped faces that expand from the upper face 30 to the lower face 28.

Thus beveling the corners of the conductive oxide layer 20 reduces the concentration of stress at the corners, and effectively suppresses the peeling of the metal layer 22 connected over this. In addition, since the contact surface area can be increased between the metal layer 22 and the conductive oxide layer 20, better adhesion is achieved between the metal layer 22 and the conductive oxide layer 20. Furthermore, the volume of the conductive oxide layer 20 is reduced, which makes it possible to reduce the electrical resistivity, and this combined with the increase in contact surface area with the metal layer 22 allows the operating voltage to be lowered, resulting in a marked increase in power efficiency.

As shown in FIG. 2A, the angle of the side faces of the conductive oxide layer 20 is suitably less than the angle of the side faces of the ridge 18 with respect to the ridge upper face. In other words, the inclination angle of the side faces of the conductive oxide layer 20 with respect to the normal direction to the ridge upper face is suitably greater than the inclination angle of the side faces of the ridge 18 with respect to the normal direction.

In FIG. 2A, the "angle" of the side faces of the conductive oxide layer refers to the angle formed by the ridge upper face 28 and the side faces 32 of the conductive oxide layer, and this angle is referred to as θ1. The "angle" of the side faces of the ridge 18 with respect to the ridge upper face refers to the angle formed by a plane corresponding to the lower face of the ridge and the side faces of the ridge, and is referred to as θ2.

In FIG. 2B, the "inclination angle" of the side faces 32 of the conductive oxide layer refers to the angle of the side faces 32 of the conductive oxide layer sloped with respect to the normal direction to the ridge upper face 28, and is indicated by θ1'. θ1+θ1' will always equal 90°. The "inclination angle" of the ridge side faces refers to the angle of the ridge side faces sloped with respect to the normal direction to the ridge upper face, and is indicated by θ2'. θ2+θ2' will always equal 90°.

If the side faces 32 of the ridge 18 and the side faces 34 of the conductive oxide layer 20 are formed continuously at the same angle with respect to the ridge upper face, the conductive oxide layer 20 and the dielectric layer 24 will lie in the same plane, so there will be no difference in the thickness in the vertical direction of the dielectric provided to the side faces of the conductive oxide layer and the side faces of the ridge.

If θ1>θ2 and θ1'<θ2', the width b2 of the refractive index difference will be too wide with respect to the width a2 of current injection, the threshold will be higher, and efficiency will suffer.

As shown in FIG. 2, by setting such that θ1<θ2 and θ1'>θ2', the dielectric layer formed on the ridge side faces will be more resistant to etching than the dielectric layer formed on the side faces of the conductive oxide layer, so the dielectric layer will tend to remain on the ridge side faces. In particular, when anisotropic RIE or another such dry etching apparatus is used to etch the dielectric layer, anisotropic etching can be carried out reliably, so the dielectric layer can be formed with good dimensional accuracy. Also, by setting such that θ1<θ2 and θ1'>θ2', the thickness in the vertical direction of the dielectric layer on the ridge side faces can be made greater than the thickness in the vertical direction of the conductive oxide layer, and a structure in which the dielectric layer is left on the ridge side faces can be produced. That is, the dielectric layer 24 can be accurately disposed on just the side faces of the ridge 18.

Consequently, the surface (that is, the upper face 30 and the side faces 34) of the conductive oxide layer can be consistently exposed from the dielectric layer 24, and the surface of the conductive oxide layer can be reliably connected to the metal layer 22. As a result, adhesion and power efficiency can be improved as mentioned above.

When θ1<θ2 and θ1'>θ2' are satisfied, the relation between the width and height of the conductive oxide layer 20 and the ridge is expressed by the following formula.

$$d2/d1 > (b2-a2)/(b1-a1)$$

Here, d1 is the height of the conductive oxide layer, and d2 is the height of the ridge 18.

Thus, the width and height of the conductive oxide layer and the ridge are preferably set so as to satisfy this formula.

In particular, when the height d1 of the conductive oxide layer is 50 angstrom or more, it is preferable to satisfy d1<a1. Consequently, in the formation of the conductive oxide layer, the conductive oxide layer can be formed more accurately by lift-off method in which a mask layer is used to form the conductive oxide layer thereover, and the mask layer is removed to form the conductive oxide layer at the portion with no mask layer.

Also, it was confirmed that cleavage is improved by forming the conductive oxide layer in a particular thickness and shape at a particular place on the second conductivity type semiconductor layer, and cleaving to form a cavity plane. The reason for this seems to be that stress produced by the conductive oxide layer affects the semiconductor layer. To improve cleavage in this way, the thickness of the conductive oxide layer (that is, the height d1) is preferably at least 0.05 μm, and more preferably about 0.1 to 0.4 μm.

Furthermore, if the height d2 of the ridge is 0.6 μm or less, the ridge will be subjected to less stress, so cleavage will be further improved. It is preferable for the height d2 of the ridge plus the thickness of the conductive oxide layer (the height d1) to be 2.0 μm or less.

In general, the semiconductor layer includes stress produced by the difference in the lattice constants between the various layers that form the semiconductor layer. In particular, the greater is the indium content, the greater is the stress on the semiconductor layer, and a stepped height differential is seen at the cleavage plane in a layer containing indium. When such a step is produced, the threshold current rises, there is a decrease or more variance in the slope angle η (slope efficiency) of the rise in emission output over the threshold value, and other such problems occur.

When a conductive oxide layer is formed and stress applied on a semiconductor layer in this state, and when the height of the ridge is 0.6 μm or less, it is believed that the stress exerted on the semiconductor layer is lessened. A step will be produced less often, regardless of the composition of the semiconductor layer, that is, even when the semiconductor layer contains indium, if cleavage is performed in a state in which less stress is exerted on the semiconductor layer. As a result, there will be less of an increase in the threshold value and less of a decrease or variance in the slope angle η (slope efficiency) of the rise in emission output.

The conductive oxide layer 20 preferably functions as both a clad layer and an electrode. Consequently, the clad layer made from a semiconductor and used in the past can be omitted, so it is possible to obtain a long-wavelength semiconductor laser element with higher reliability and less cracking. Also, eliminating the clad layer suppresses the increase in operating voltage of the semiconductor laser element.

The "clad layers" referred to in this Specification are, as discussed below, layers with a thickness of at least 100 nm and a lower refractive index than a well layer, of the films located above and below the active layer (including the well layer and a barrier layer). These may be multilayer films, a super-lattice structure, or a GRIN structure. Thus providing clad layers with a low optical refractive index above and below the active layer has the function of confining light in the active layer. Without these clad layers, the threshold current would increase several times over, and in some cases there might be no laser oscillation at all.

That is, functioning as a clad layer essentially means confining light, and whether or not a given layer functions as a clad layer can be confirmed by equivalent refractive index simulation or the like. For instance, an equivalent refractive index simulation is performed by the proportional calculation of the refractive index of various layers, on the basis of the crystal mixture ratio of the semiconductors constituting those layers, using 2.368, 2.122, and 2.8 as the refractive indexes of GaN, AlN, and InN at 500 nm. As a result of this simulation, a layer may be considered a clad layer when it is above or below a region where the optical intensity is at least 0.5, with this region extending to a specific layer above or below the active layer and on either side of the active layer, using a maximum optical intensity of 1.0 (if the value is at least 0.5 at a midway layer, anything from that point on is considered a clad layer). Accordingly, a clad layer is sometimes a multi-layer film. Also, more simply, the size of the waveguide path can be estimated from the near field pattern of the semiconductor laser element, and any layer at a location matching this waveguide path size can be concluded to be a clad layer.

In order for the conductive oxide layer 20 to function as a clad layer, the refractive index of the conductive oxide layer is preferably lower than the refractive index of the semiconductor layer. Examples of the conductive oxide layer include a layer containing at least one element selected a group consisting of Zinc (Zn), Indium (In), tin (Sn), gallium (Ga), aluminum (Al), copper (Cu), silver (Ag), nickel (Ni), gold (Au), lantern (La), strontium (Sr), fluorine (F) and magnesium (Mg). More specifically, examples include ZnO (refractive index: approximately 1.95), $In_2O_3$, $SnO_2$, ATO, ITO (a compound oxide of indium and tin), IZO, and MgO. Of these, ITO (refractive index: approximately 2.0) is preferable.

Not only does this conductive oxide layer not absorb visible light, but neither does is absorb light with a wavelength of 360 to 650 nm, for example, and preferably is able to transmit light efficiently, such as at a transmissivity of at least 90%, or at least 85%, or at least 80%. Consequently, it can be utilized as an electrode for a semiconductor laser element of the intended wavelength. Furthermore, the conductive oxide layer preferably has a resistivity of no more than $1 \times 10^{-3}$ Ωcm, and more preferably about $1 \times 10^{-4}$ Ωcm to $1 \times 10^{-6}$ Ωcm, for example. This allows it to be utilized effectively as an electrode.

The conductive oxide layer 20 is preferably formed apart from a cavity plane. If the conductive oxide layer 20 extends all the way to the cavity plane, current ends up being injected all the way to the cavity plane, and heat is generated near the cavity plane, with this heat generation being particularly pronounced with a high-output element, so there is the risk that the COD level will drop. In view of this, the conductive oxide layer 20 is preferably not formed at both ends in the stripe direction of the ridge, so as to be apart from the cavity plane, and furthermore, a material whose refractive index is preferably close to that of the conductive oxide layer is preferably provided in a region where the conductive oxide layer 20 is not formed, so as to reduce the refractive index differential from the plane side where the conductive oxide layer is not formed. This minimizes loss of FFP shape.

(Substrate)

The substrate is preferably a sapphire, spinel ($MgAl_2O_4$), silicon carbide, silicon, ZnO, GaAs, or nitride substrate (GaN, AlN, etc.). The thickness of the substrate is about 50 μm to 10 mm, for example. Here, the nitride substrate can be formed by MOVPE, MOCVD (metal-organic chemical vapor deposition), HVPE (hydride vapor phase epitaxy), or another such vapor phase epitaxy method, a wet heat synthesis method in which crystals are grown in a critical fluid, a high-pressure method, a flux method, a molten method, or the like. A commercially available substrate may be also be used. This substrate is more preferably a nitride substrate having an off angle of about 0.03 to 10° on a first main face and/or a second main face, for example. The number of dislocations per unit of surface area may be $1 \times 10^7/cm^2$ or less, for example.

The substrate may have n-type conductivity, or p-type conductivity. As to the planar orientation of the growth plane on which the semiconductor layer is grown, C plane (0001), A plane (11-20), M plane (1-100), or semipolar plane (11-22), (20-21), (10-1-1), (10-1-2), or other such substrate can be used.

(Semiconductor Layer)

The semiconductor layer is constituted by a laminate composed of the first conductivity type semiconductor layer 12, the active layer 14, and the second conductivity type semiconductor layer 16.

There are no particular restrictions on how the semiconductor layer is grown on the substrate, but all known methods for growing nitride semiconductors can be used, such as MOVPE (metal-organic vapor phase epitaxy), MOCVD (metal-organic chemical vapor deposition), HVPE (hydride vapor phase epitaxy), or MBE (molecular beam epitaxy). In particular, MOCVD is favorable because it results in good crystallinity under conditions ranging from reduced pressure to atmospheric pressure.

There are no particular restrictions on the first conductivity type semiconductor layer, but a compound semiconductor, and particularly one expressed by the general formula $In_xAl_yGa_{1-x-y}N$ ($0 \leq x \leq 1$, $0 \leq y \leq 1$, $0 \leq x+y \leq 1$), is preferable. In addition, a compound partially substituted with boron as a group III element may be used, or a compound in which part of the nitrogen is substituted with phosphorus and arsenic as group V elements may be used. The terms "first conductivity type" and "second conductivity type" mean that one is n-type and the other p-type. The n-type semiconductor layer may contain one or more of silicon, germanium, tin, sulfur, oxygen, titanium, zirconium, cadmium, or another such group IV element, group VI element, or the like as an n-type impurity. The p-type semiconductor layer contains magnesium, zinc, beryllium, manganese, calcium, strontium, or the like as a p-type impurity. The impurities are preferably contained in a concentration of about $5 \times 10^{16}/cm^3$ to $1 \times 10^{21}/cm^3$, for example. The impurities do not necessarily need to be contained in all the semiconductor layers that make up the first conductivity type semiconductor layer and the active layer second conductivity type semiconductor layer.

The first conductivity type semiconductor layer and/or the second conductivity type semiconductor layer preferably has a light guide layer, and more preferably has an SCH (separate confinement heterostructure), which is a structure in which these light guide layers sandwich the active layer. The light guide layer of the first conductivity type semiconductor layer and the light guide layer of the second conductivity type semiconductor layer may have mutually different compositions and/or film thicknesses.

For instance, the first conductivity type semiconductor layer (hereinafter also referred to as the n-type semiconductor layer or n-side semiconductor layer), the active layer, and the second conductivity type semiconductor layer (hereinafter also referred to as the p-type semiconductor layer or p-side semiconductor layer) may have a super-lattice structure composed of two layers with mutually different compositional ratios or a multilayer film structure. These layers may also have a compositional gradation layer and a concentration gradation layer.

The n-type semiconductor layer may have a structure of two or more layers with different compositions and/or impurity concentrations.

For instance, the first n-type semiconductor layer can be formed from $In_xAl_yGa_{1-x-y}N$ ($0 \leq x \leq 1$, $0 \leq y \leq 1$, $0 \leq x+y \leq 1$), with $Al_xGa_{1-x}$ ($0 \leq x \leq 0.5$) being preferable, and $Al_xGa_{1-x}$ ($0 \leq x \leq 0.3$) being even better. More specifically, the preferable growth conditions are to form in a reaction furnace at a growth temperature of 900° C. or higher. Also, the first n-type semiconductor layer can function as a clad layer. A good film thickness is about 0.5 to 5 μm. As will be discussed below, when a conductive oxide layer with a low refractive index is provided on the n-type semiconductor layer side, the first n-type semiconductor layer can be omitted.

The second n-type semiconductor layer can function as a light guide layer, and can be formed from $In_xAl_yGa_{1-x-y}N$ ($0 \leq x \leq 1$, $0 \leq y \leq 1$, $0 \leq x+y \leq 1$). A film thickness is suitably 0.1 to 5 μm. The second n-type semiconductor layer can be omitted.

One or more semiconductor layers may be additionally formed between the n-type semiconductor layers.

The active layer may have a multiple quantum well structure or a single quantum well structure. A well layer preferably has the general formula $In_xAl_yGa_{1-x-y}N$ ($0 \leq x \leq 1$, $0 \leq y \leq 1$, $0 \leq x+y \leq 1$) containing at least indium. Raising the indium content makes emission in the long wavelength band possible, and raising the aluminum content makes emission in the ultraviolet band possible. Emission is possible in a wavelength band of about 300 to 650 nm. Forming the active layer as a quantum well structure improves the emission efficiency.

A p-type semiconductor layer is laminated on the active layer. The first p-type semiconductor layer can be formed by $Al_xGa_{1-x}$ ($0 \leq x \leq 0.5$) containing a p-type impurity. The first p-type semiconductor layer functions as a p-side electron confinement layer. There are no particular restrictions on the thickness of the first p-type semiconductor layer, but it is 200 angstrom or less, for example.

The second p-type semiconductor layer can function as a light guide layer, and can be formed from $In_xAl_yGa_{1-x-y}N$ ($0 \leq x \leq 1$, $0 \leq y \leq 1$, $0 \leq x+y \leq 1$). There are no particular restrictions on the thickness of the second p-type semiconductor layer, but it is 3000 to 8000 angstrom, for example.

A super-lattice layer composed of $Al_xGa_{1-x}$ ($0 \leq x$ 0.5) or AlGaN and GaN containing a p-type impurity and functioning as a clad layer can be formed over the second p-type semiconductor layer, but this layer may also be omitted. Omitting this layer eliminates the time it would otherwise take to grown the p-side semiconductor layer after the growth of the active layer.

In general, it is preferable for the p-side semiconductor layer to be laminated at a higher temperature than the active layer or the n-side semiconductor layer in order to lower the resistance of the p-side semiconductor layer. However, if the p-side semiconductor layer is grown at a high temperature, the active layer, which has a high indium mixed crystal ratio, may decompose. Therefore, omitting this layer reduces such problems as damage to the active layer that would be caused by growing the p-side semiconductor layer at a high temperature. Furthermore, the number of laminations of p-side semiconductor layers, which have high resistance, can be reduced, so the operating voltage can be lowered.

The third p-type semiconductor layer can be formed from $Al_xGa_{1-x}N$ ($0 \leq x \leq 1$) containing a p-type impurity. The third p-type semiconductor layer can be formed as a layer that contacts with the above-mentioned conductive oxide layer 20. Since a higher aluminum content tends to raise the voltage, it is preferable if $0 \leq x \leq 0.3$. Also, it is preferable if x=0, that is, to use GaN, because magnesium, a p-type impurity, is readily activated and there is less ohmic resistance with the conductive oxide layer.

Mixed crystals of indium may be formed in these semiconductor layers.

Also, the first p-type semiconductor layer and the second p-type semiconductor layer can be omitted.

A film thickness of the each layer is suitably 3 to 300 nm.

One or more semiconductor layers may be additionally formed between the p-type semiconductor layers.

If the total thickness of the p-side semiconductor layers is 700 nm or less, and if the aluminum-containing layer thickness is 600 nm or less, cleavage will be better and there will be a reduction in steps at the cleavage plane and so forth.

With a semiconductor laser element with a comparatively long wavelength of 440 nm or more, the aluminum mixed crystal ratio must be raised in the clad layers on the p-side and/or the n-side in order to provide enough of a refractive index differential. Also, with a semiconductor laser element that oscillates light in the ultraviolet band of 380 nm or less, the absorption of light can be prevented by forming a layer with a high aluminum mixed crystal ratio. However, if a layer with a high aluminum mixed crystal ratio is formed, cracks tend to develop in the semiconductor layers. Therefore, omitting the clad layers results in a semiconductor laser element with a long wavelength, fewer cracks, and better reliability.

(Dielectric Layer)

The dielectric layer 24 ensures insulation of the ridge side faces from the p-side semiconductor layer (ridge bottom face region), and ensures a refractive index differential with respect to the p-side semiconductor layer, and thereby has a function of suppressing the leakage of light from the active layer. Accordingly, it is good for the dielectric layer 24 to be formed from a material with a lower refractive index than that of the semiconductor layers. Examples include Si, Mg, Al, Hf, Nb, Zr, Sc, Ta, Ga, Zn, Y, B, Ti, and Oxides (such as $SiO_2$, $Al_2O_3$, $Nb_2O_3$, $TiO_2$, $Ta_2O$), nitrides (such as AlN, AlGaN and BN), fluoride, and the like. Of these, $ZrO_2$ and $SiO_2$ (refractive index: approximately 1.45) are preferable.

The dielectric layer may be a single layer, or a plurality of materials with different compositions may be laminated and used to obtain the desired refractive index. There are no particular restrictions on the thickness of the dielectric film, which can be suitably adjusted according to the composition, refractive index, and so forth of the material, but it is good for the thickness to be about the same as that of the conductive oxide layer. More specifically, an example is about 0.1 to 2.0 μm.

Furthermore, as shown in FIG. 1, this semiconductor laser element may have a protective film 25 formed on the side faces of the semiconductor layer. The protective film 25 may be composed of an electrically insulating material, and preferably is composed of a material whose refractive index is lower than that of the semiconductor layer.

With the semiconductor laser element shown in FIG. 1, the protective film 25 is laminated on the dielectric layer 24 that is isolated from the ridge, and is formed so as to cover the semiconductor layer from the upper face to the side faces. The dielectric layer 24 and the protective film 25 may both be made of the same material, may be made of different materials.

(Other Constitution)

With the semiconductor laser element of the present invention, an insulating protective film, or a protective film composed of a nitride, for example, is formed on the front and/or rear end face of the cavity plane. The dielectric layer 24 and the protective film 25 may be composed of an electrically insulating material, and is preferably composed of a material whose refractive index is lower than that of the semiconductor layer.

(Method for Manufacturing Semiconductor Laser Element)

Figure 4:
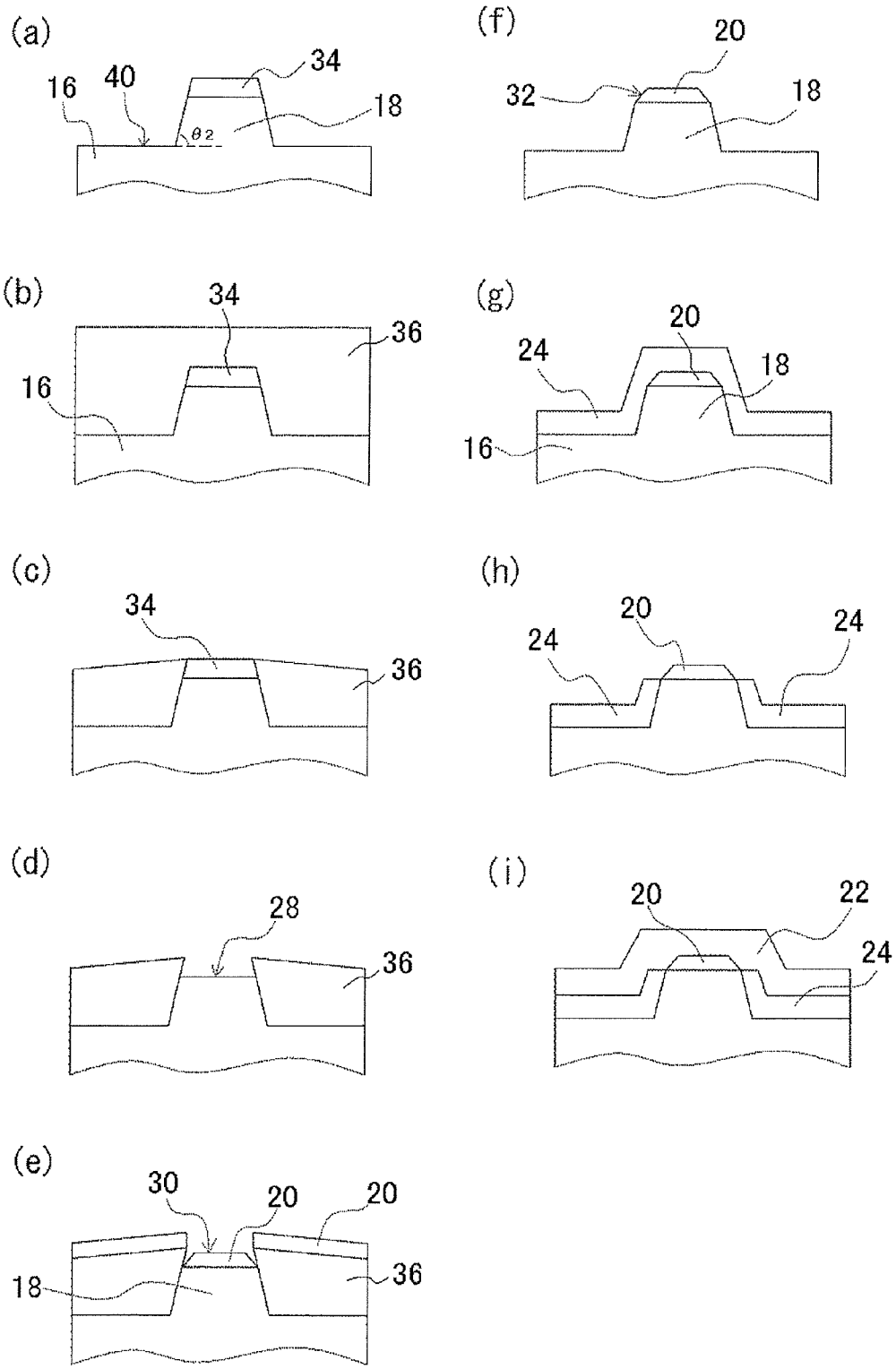
FIG. 4 are schematic cross sectional views for describing the method for manufacturing the semiconductor element according to an embodiment of the present invention.

As shown in steps (a) to (i) in FIG. 4, in the method for manufacturing the semiconductor laser element of the present invention, first, in step (a), a semiconductor layer including an active layer is formed on a substrate. The semiconductor layer here is produced by laminating the first conductivity type semiconductor layer 12 (n-side semiconductor layer), the active layer 14, and the second conductivity type semiconductor layer 16 (p-side semiconductor layer) in that order on a substrate.

Next, a mask layer with a specific shape is formed on the semiconductor layer of the wafer produced by laminating the semiconductor layer on the substrate.

Just one method for forming the mask layer is disclosed below, but the method for forming the mask layer is not limited to this.

First, a mask layer 34 and a resist layer (not shown) are formed in that order on the semiconductor layer. This resist layer is patterned in a specific shape, and the resist layer is used as a mask to pattern the mask layer in the same shape. After the mask layer has been patterned, the resist layer is removed to form a mask layer of the required shape. Examples of the material used for the mask layer here include $SiO_2$, SiON, and SiN. Other commonly known mask materials may be used for this mask layer instead. There are no particular restrictions on the thickness of the mask layer, but about 100 to 1000 nm is favorable, for example, and about 200 to 600 nm is preferable. The mask layer can be formed by CVD, sputtering, vapor deposition, or another known method.

A ridge is then formed over the semiconductor layer. This ridge is formed by removing a part of the p-side semiconductor layer on the upper face of the semiconductor layer from the open in the mask layer.

There are no particular restrictions on how part of the p-side semiconductor layer is removed, but either wet etching or dry etching may be used. More specifically, this layer is preferably removed by taking the material of the semiconductor layer into account in selecting an etchant that will afford greater latitude in the etching of the mask layer. The size of the ridge substantially corresponds to the size of the mask layer, but the ridge may have a bi-mesa shape, in which the stripe width narrows as the width on the bottom face side thereof increases and nears the upper face, or a shape having side faces perpendicular to the lamination face, or a combination of these shapes.

The angle of the ridge side faces, that is, $\theta 2$ shown in FIG. 4a, is preferably 60° to 90°, and more preferably 70° to 90°, and even more preferably 80° to 90°. Since the ridge here is formed in a state in which the mask layer 34 is laminated over the upper face of the ridge, the side faces of the mask layer 34 preferably have an angle that is substantially the same as the angle of the ridge. In other words, the inclination angle $\theta 2'$ of the ridge side faces is preferably 0° to 30°.

In step (b), a second mask layer 36 is formed at least from the bottom face region on both sides of the ridge to a region reaching above the mask layer 34 on the ridge upper face. The second mask layer 36 is formed not only on the ridge bottom face region and the ridge side faces, but also in the region of the ridge upper face where the mask layer 34 is formed. There are no particular restrictions on the material of the second mask here, but the resist layer is preferably patterned. There are no particular restrictions on the thickness of the second mask layer, but an example is about 0.1 to 3.0 μm.

In step (c), the second mask pattern is formed. An example of how this pattern is formed is a method in which the mask layer is dissolved using a suitable etchant by wet etching, dry etching, or the like from the surface of the second mask layer 36 formed in step (b), thereby removing part of this layer, making it into a thin-film, etc. This allows the mask layer to be exposed. That is, an opening can be formed in the same shape as the ridge at the position where the ridge is formed. An example of how an opening is formed in the second mask is a method in which the material of the resist pattern and so forth are taken into account in selecting a suitable etchant and using photolithography to perform wet etching, dry etching, or the like. Examples include nitric acid, hydrofluoric acid, dilute hydrochloric acid, dilute nitric acid, sulfuric acid, hydrochloric acid, acetic acid, hydrogen peroxide, or another such acid, either alone or as a mixture of two or more types; ammonia or another such alkali solution, either alone or as a mixture of ammonia and hydrogen peroxide or the like; various surfactants; and other such suitable etchants. Any known method can be used to remove the second mask remaining at undesired locations, such as dipping, ultrasonic treatment, or a combination of these. These can also be used in the removal of other mask layers or a third mask layer.

The opening formed in the second mask layer 36 is preferably narrower than the width of the ridge upper face (a1). This allows for easy formation of a conductive oxide layer having a sloped part on the side faces. Also, the upper face of the second mask layer 36 is formed so as to be located higher than the upper face 28 of the ridge. For instance, as shown in FIG. 4c, the upper face of the mask layer 34 at the upper part of the ridge can be formed so as to lie in substantially the same plane as the upper face of the second mask layer 36.

In step (d), the mask layer 34 is removed from the ridge upper face. Wet etching or another such etching method is preferably used to remove this mask layer 34. The method discussed above for forming the opening in the second mask layer 36 can be utilized as the method for removing the mask layer 34 here. As a result, a recess is formed in the portion where the second mask layer 36 is removed, and the ridge upper face 28 is exposed at the bottom face of this recess.

In step (e), the conductive oxide layer 20 is formed on the ridge upper face 28 and the second mask layer 36. Here, the conductive oxide layer 20 is formed on the ridge upper face exposed after the removal in step (d) above. Any known method can be used to form the conductive oxide layer, but using sputtering or vapor deposition is preferable. Here, a conductive oxide layer having a flat upper face 30 and sloped parts 32 can be formed because the opening in the second mask layer 36 is a recess. Also, the width of the electrode contacting with the ridge upper face is substantially the same as that width of the ridge. However, if the ridge width is 7.0 μm or greater, the electrode may be formed narrower than the ridge width.

In step (h) discussed below, in order for the dielectric layer 24 to be left behind on the side faces of the ridge and the ridge bottom face region, and for the dielectric layer 24 to be removed from the region contacting with the conductive oxide layer 20, and for this to be accomplished accurately, the angle ($\theta 1$) of the side faces of the conductive oxide layer 20 is set smaller than the angle ($\theta 2$) of the ridge side faces. In other words, the inclination angle ($\theta 1'$) of the side faces of the conductive oxide layer 20 is set larger than the inclination angle ($\theta 2'$) of the ridge side faces.

$\theta 1$ is preferably from 45° to 85°, and more preferably from 60° to 80°. $\theta 1'$ is preferably from 15° to 45°, and more preferably from 10° to 30°.

In step (f), the ridge bottom face region and the ridge side faces are exposed by removing the second mask layer 36 and the conductive oxide layer 20 thereon. Removing the second mask layer 36 here simultaneously removes the conductive oxide layer that is above. Any of the removal methods discussed above may be used to remove the second mask layer 36 here, but the use of a lift-off method or wet etching is preferable.

In step (g), the dielectric layer 24 is formed from the ridge bottom face region all the way to the upper face of the conductive oxide layer. This dielectric layer 24 can be formed by any method known in this field, such as sputtering, vacuum vapor deposition, or vapor phase epitaxy.

In step (h), the dielectric layer 24 is removed from the surface of the conductive oxide layer 20 in a state in which the dielectric layer 24 is left on the side faces of the ridge.

There are no particular restrictions on the removal method here, but an etch-back method is preferable.

An example of the method for removing the dielectric layer 24 from the surface of the conductive oxide layer 20 in a state in which it is left on the ridge side faces and the ridge bottom face region 40 will be described through reference to FIG. 5.

Figure 5:
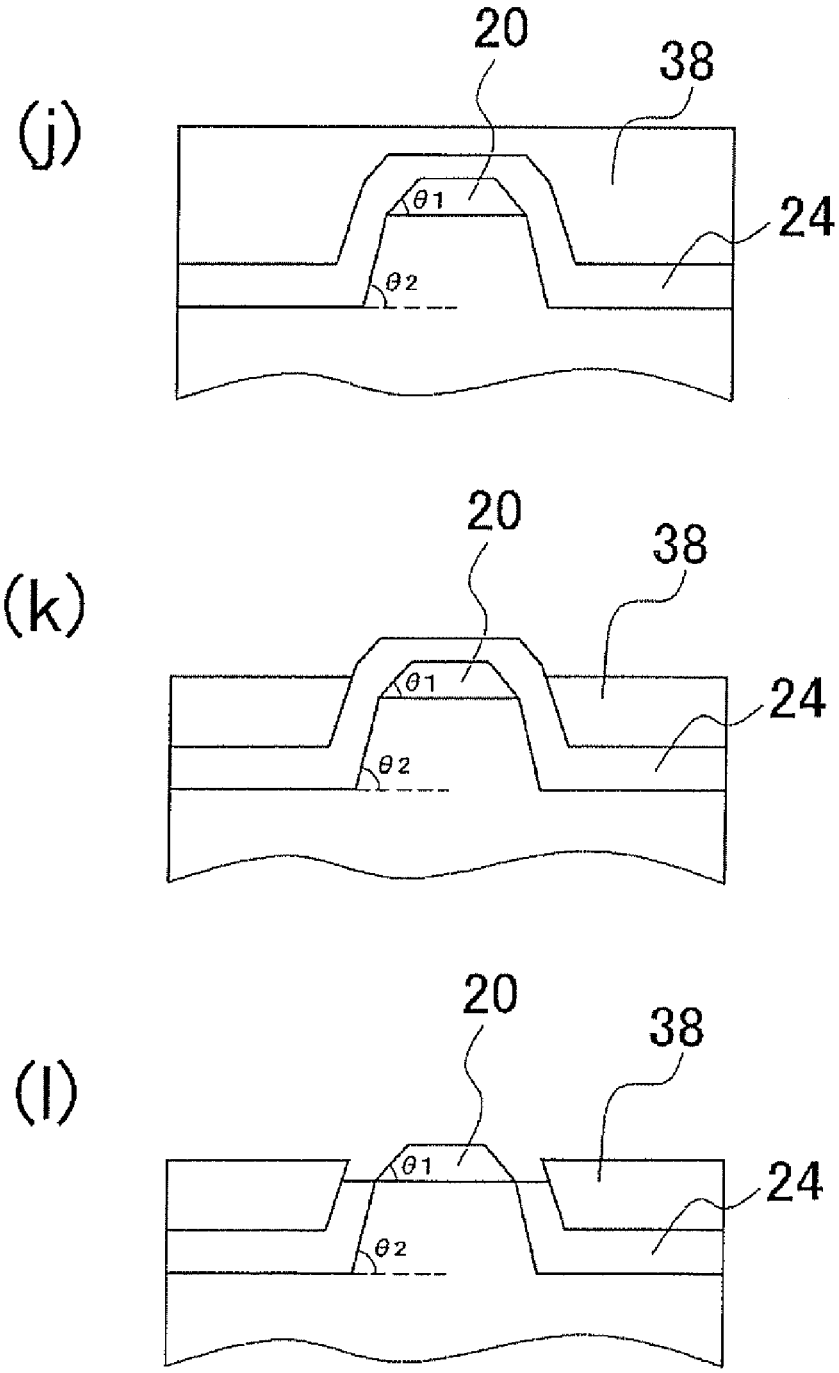
FIG. 5 are schematic cross sectional views for describing the method for manufacturing the semiconductor element according to an embodiment of the present invention.

In step (g), a third mask 38 is formed so as to cover the dielectric layer 24, in a state in which the dielectric layer 24 has been formed from the ridge bottom face region all the way to the upper face of the conductive oxide layer, and as shown in step (j) in FIG. 5.

Next, in step (k), wet etching is performed with a suitable etchant from the surface of the third mask layer 38. The upper face of the third mask layer 38 here is etched so that it is located slightly higher than the lower face of the conductive oxide layer 20. Consequently, the dielectric layer 24 is removed from the upper face of the third mask layer 38 and from the area slightly lower than this, and the surface of the conductive oxide layer can be exposed so that it is not covered, allowing the dielectric layer 24 to be formed so that it can completely cover the ridge side faces and the ridge bottom face region.

The side faces of the conductive oxide layer 20 formed on the ridge have a smaller angle than the ridge side faces because of step (e). Specifically, if θ1<θ2 and θ1'>θ2', the dielectric layer formed on the ridge side faces will be more resistant to etching than the dielectric layer formed on the side faces of the conductive oxide layer. Thus, in a state in which θ1<θ2 and θ1'>θ2', the upper face of the third mask layer 38 is etched so as to be located slightly higher than the lower face of the conductive oxide layer 20, allowing the dielectric layer 24 to be disposed more accurately.

Thus, in a state in which the dielectric layer 24 is left on the ridge side faces and is removed from the surface of the conductive oxide layer 20, in step (i) a metal layer 22 is formed that covers the upper face 30 of the conductive oxide layer 20 and the sloped parts 32 of the side faces.

The metal layer 22 can be used as what is known as a pad electrode, and is preferably a laminated film composed of Ni, Ti, Au, Pt, Pd, W, or another such metal. More specifically, an example is a film formed in the order of W—P—Au, Ni—Ti—Au, or Ni—Pd—Au, starting from the conductive oxide layer side. There are no particular restrictions on the film thickness of the pad electrode, but the thickness of the final Au layer is preferably at least about 100 nm. There are no particular restrictions on the shape of the metal layer 22.

Figure 6:
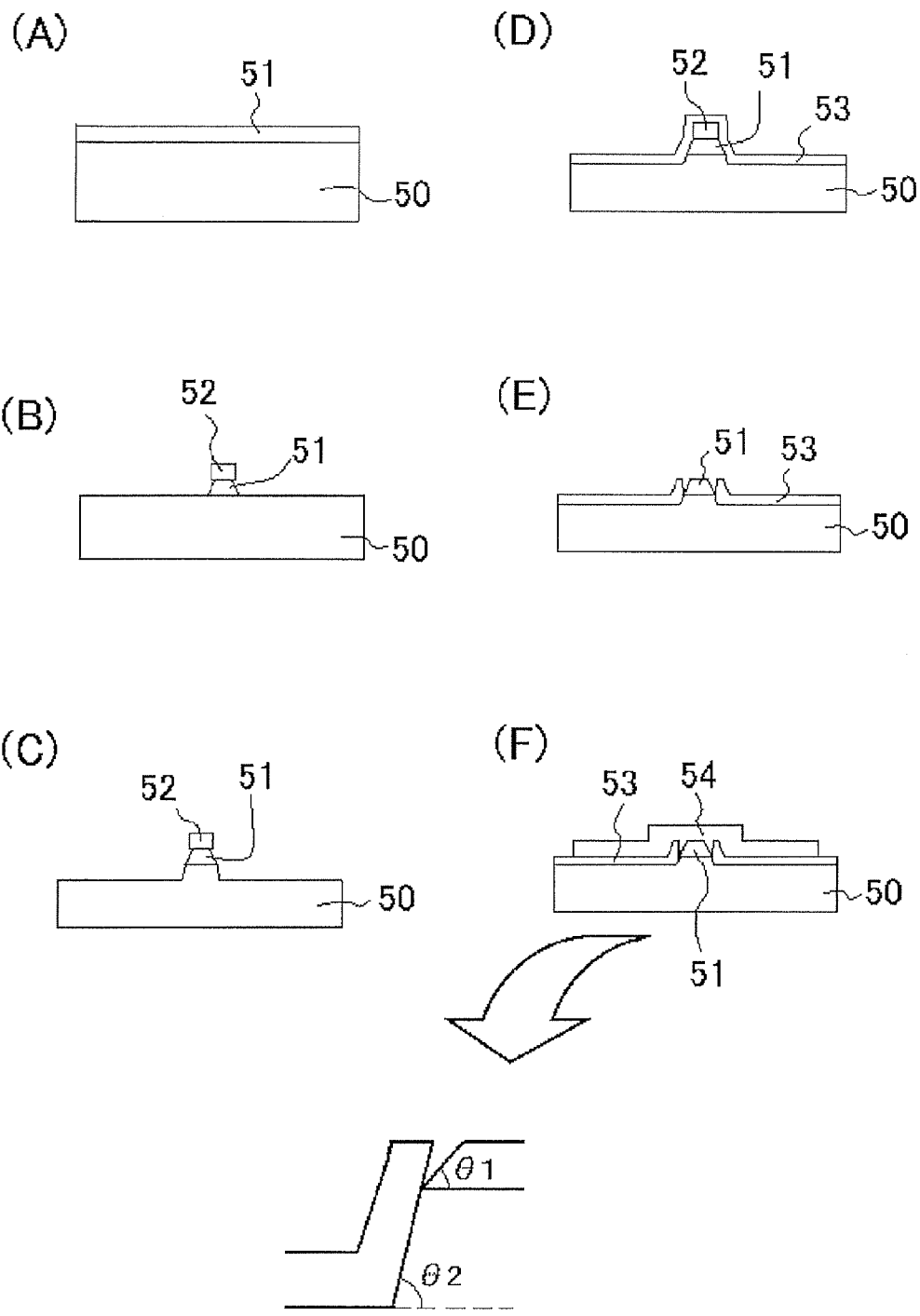
FIG. 6 are schematic cross sectional views for describing the method for manufacturing the semiconductor element according to another embodiment of the present invention

Another method for manufacturing a semiconductor laser element is illustrated in steps (A) to (F) in FIG. 6. First, in step (A), just as above, a first conductivity type semiconductor layer, an active layer, a second conductivity type semiconductor layer, and a conductive oxide layer are laminated in that order on a substrate to form a semiconductor layer 50, over which is formed a conductive oxide layer 51.

In step (B), a mask layer 52 is formed in a specific shape over the conductive oxide layer 51. The mask layer 52 here can be formed by the same method as discussed above. The conductive oxide layer 51, whose side faces are sloped, is patterned by utilizing this mask layer 52 to remove the conductive oxide layer 51 exposed from the mask layer 52. The removal here is favorably accomplished by etching as discussed above, and anisotropic etching such as RIE can be used to advantage. Conditions are selected here so that a certain amount of the mask layer 52 can also be removed. This causes the mask layer 52 to recede in the horizontal direction with respect to the upper face of the semiconductor layer 50. As a result, part of the conductive oxide layer 51 present directly under the side faces of the mask layer 52 is removed, producing a tapered shape. That is, the slight horizontal recession of the mask layer produced by etching, coupled with anisotropic etching, serves to vary the extent of etching in the thickness direction of the conductive oxide layer 51. Consequently, the side faces of the conductive oxide layer 51 can be sloped.

In step (C), the mask layer 52 and the conductive oxide layer 51 are used to remove a part of the second conductivity type semiconductor layer and form a ridge. The formation of this ridge can be accomplished in substantially the same manner as discussed above. The removal of the second conductivity type semiconductor layer here is preferably accomplished by etching under conditions such that the etching rate is different for the semiconductor layer and for the conductive oxide layer. Consequently, the horizontal recession of the mask layer in step (B) can be suppressed so that it does not occur in the conductive oxide layer. Also, it is preferable to use anisotropic etching. Thus, changes in the extent of etching of the conductive oxide layer in the thickness direction can be kept to a minimum, and the side faces of a second conductive oxide layer (that is, ridge) can be kept to an angle that is greater than the angle of the side faces of the conductive oxide layer 51, so as to satisfy the above-mentioned relation. In other words, the inclination angle of the ridge side faces can be made smaller than the inclination angle of the side faces of the conductive oxide layer 51.

In step (D), a dielectric layer 53 is formed over the second conductivity type semiconductor layer including the ridge, just as above, with the mask layer 52 left in place.

In step (E), the mask layer 52 is removed. This removal of the mask layer 52 is favorably accomplished by a lift-off method. Consequently, the dielectric layer 53 adheres to the ridge side faces with a large angle, while the dielectric layer 53 does not adhere to the side faces of the conductive oxide layer 51 with a smaller angle and located on the ridge, so the dielectric layer 53 can be isolated here. Consequently, the surfaces of the conductive oxide layer 51, that is, the upper face and the sloped side faces, can both be exposed.

In step (F), as described above, a metal layer 54 is formed on at least the upper face of the conductive oxide layer 51 and the dielectric layer 53.

With the method for manufacturing a semiconductor laser element of the present invention, it is preferable if the second main face of the substrate is ground at some stage, such as prior to the formation of the n-side electrode as discussed below. Any method that is known in this field can be utilized for the grinding of the substrate.

Furthermore, an n-side electrode is preferably formed on all or part of the second main face of the substrate, either before or after the formation of the above-mentioned conductive oxide layer. The n-side electrode can be formed, for example, by sputtering, CVD, vapor deposition, or the like. A lift-off method can be favorably used in the patterning of the n-side electrode, and after the n-side electrode has been formed, it is preferably annealed at about 300° C. or higher. The total film thickness of the n-side electrode is about 1 μm or less, for example. There are no particular restrictions on the material of the n-side electrode, and V (the thickness: 10 nm)-Pt (the thickness: 200 nm)-Au (the thickness: 300 nm) laminated from the substrate side, for example. Other Examples include Ti (15 nm)-Pt (200 nm)-Au (300 nm), Ti (10 nm)-Al (500 nm), Ti (6 nm)-Pt (100 nm)-Au (300 nm), Ti (6 nm)-Mo (50 nm)-Pt (100 nm)-Au (210 nm).

A metallized electrode may be formed over the n-side electrode. The metallized electrode may be formed of Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge and the like, for example. There are no particular restrictions on the thickness of the metallized electrode. If ohmic characteristics can be maintained with a metallized electrode alone, then the n-side electrode can be omitted.

If desired, a protective film 25 may be formed over the dielectric layer 24 after step (h), for example. The protective film 25 can be formed by any method known in this field.

A cavity plane is formed in the semiconductor layer. The cavity plane can be formed by any method known in this field, such as by etching or cleavage. If the cavity plane is formed by cleavage, a groove that aids cleavage is preferably formed in a region isolated from the ridge. The distance from this auxiliary groove is preferably at least 40 μm, and more preferably at least 80 μm. Forming an auxiliary groove at a range such as this reduces the height difference of the cleavage plane around the ridge, while preserving the accuracy of cleavage at the desired location.

Also, a protective film is preferably formed at the desired stage at the cavity plane thus obtained, that is, the light emission face and/or the light reflecting side of the cavity plane. The protective film is preferably a single layer or multiple layers of $SiO_2$, $ZrO_2$, $TiO_2$, $Al_2O_3$, $Nb_2O_5$, AlN, AlGaN and the like.

Furthermore, a semiconductor element chip can be obtained by dividing in the cavity direction. This division can be accomplished by forming grooves that aid in division at some stage of the process, and using these grooves for scribing, etc.

With the method of the present invention for manufacturing a semiconductor laser element, the upper face and side faces of the conductive oxide layer can be stably exposed from the dielectric layer, and the ridge side faces can be covered more or less completely by the dielectric layer. Consequently, the formation of the dielectric layer can be controlled accurately, and the manufacturing yield of semiconductor laser elements can be raised.

Examples of the semiconductor laser element of the present invention will now be described, but the present invention is not limited to or by the examples that follow.

Example 1

As shown in FIG. 1, the semiconductor laser element in this Example is such that an n-side semiconductor layer 12, an active layer 14, and a p-side semiconductor layer 16 are laminated in that order on a GaN substrate 10 whose growth plane is the C plane, thereby forming a semiconductor layer, and a stripe-shaped ridge 18 is formed on the upper face of the p-side semiconductor layer 16.

Also, a conductive oxide layer 20 is connected on the ridge 18. A metal layer 22 is formed on this conductive oxide layer 20 so that in a cross section perpendicular to the stripe direction of the ridge, the side faces of the conductive oxide layer are sloped with respect to the upper face of the ridge, and a dielectric layer 24 and the upper face and side faces of the conductive oxide layer are covered. Furthermore, although not shown in FIG., a dielectric film composed of $Al_2O_3$ is formed at the cavity plane of the semiconductor layer.

This semiconductor laser element can be formed by the following manufacturing method.
(Formation of Ridge)

First, the GaN substrate 10 is provided. Then, the n-side semiconductor layer 12, the active layer 14, and the p-side semiconductor layer 16 are laminated in that order on the substrate 10 to form a semiconductor layer.

The composition of the well layer of the active layer 14 is $In_{0.20}Ga_{0.80}N$, the oscillation wavelength is 445 nm, and in the p-side semiconductor layer 16, AlGaN is laminated in a thickness of 10 nm as a first p-type semiconductor layer, AlGaN is laminated in a thickness of 0.5 μm as a second p-type semiconductor layer, and GaN is laminated in a thickness of 15 nm as a third p-type semiconductor layer.

After this, an $SiO_2$ film is formed in a thickness of 500 nm as a mask layer 34 with a CVD apparatus over substantially the entire surface of the p-side semiconductor layer 16. After this, a pattern is formed with the width of the mask layer being 15.0 μm by etching with an RIE (reactive ion etching) apparatus. The width of the mask layer here shall be considered the ridge width that is discussed below.

Next, as shown in FIG. 4a, a ridge is formed over the upper face of the laminated semiconductor layer. More specifically, the ridge 18 is formed on the upper face of the p-side semiconductor layer 16, which is the upper layer of the semiconductor layer. Here, an RIE apparatus is used to etch the p-side semiconductor layer 16 exposed at the opening in the mask layer, which forms the ridge 18 in a stripe shape having a width of about 15.0 μm and a height of about 0.45 μm. The angle θ2 of the ridge side faces is 78°, and the inclination angle θ2' is 12°.

After this, as shown in FIG. 4b, a second mask layer 36 is formed that covers the upper face of the mask layer 34 from a ridge bottom face region 40. This second mask layer is formed at a resist layer thickness of 1.2 μm.

Then, as shown in FIG. 4c, the second mask layer 36 is etched until the mask layer 34 is exposed. More specifically, an RIE apparatus is used to etch the second mask layer 36.

Next, as shown in FIG. 4d, the mask layer 34 exposed in the previous step is removed by wet etching. This etching exposes the ridge upper face 28.
(Formation of Conductive Oxide Layer)

Then, as shown in FIG. 4e, the conductive oxide layer 20 is formed on the ridge 18 and the second mask layer 36. Since this conductive oxide layer is formed over the ridge through the opening in the second mask layer, a flat face is formed in the center part of the ridge, which is directly under the opening, and sloped parts 32 are formed on both outer sides of this flat face. The material of this conductive oxide layer is ITO, which is applied using a sputtering apparatus.

Here, the width a1 of the upper face of the conductive oxide layer is 13.0 μm, and the width b1 of the lower face is 15.0 μm. The thickness d1 of the conductive oxide layer is 400 nm. The angle θ1 of the side faces of the ridge with respect to the upper face is 63°, the inclination angle θ1' is 27°, and the relation θ1<θ2 and θ1'>θ2' is satisfied.

Next, as shown in FIG. 4f, the second mask layer 36 is removed, which simultaneously removes the conductive oxide layer formed on it. The second mask layer is removed by a lift-off method employing a peeling solution, and the conductive oxide layer on this second mask layer is removed at the same time as the second mask layer. Since the conductive oxide layer 20 is in contact with the semiconductor layer only at the ridge upper face 28, there is no current leakage.
(Formation of Dielectric Layer)

Next, as shown in FIG. 4g, the dielectric layer 24 is formed so as to cover the upper face of the conductive oxide layer, the sloped faces of the conductive oxide layer, and the ridge side faces from the ridge bottom face region 40. This dielectric layer is formed by an $SiO_2$ film in a thickness of 200 nm using a sputtering apparatus.

Next, a resist layer is formed over the entire surface of the $SiO_2$ film as a third mask layer 38 in a thickness of 2.5 μm. As shown in FIG. 5k, this third mask layer 38 (resist layer) is flattened out by etch-back using oxygen. Consequently, the third mask layer 38 has openings formed at locations corresponding to the upper part of the ridge side faces and the upper face of the ridge on which the conductive oxide layer is formed.

Then, as shown in FIG. 5l, the dielectric layer 24 that covers the upper face of the conductive oxide layer 20 is removed by dry etching. Since the angle θ2 of the ridge side faces is larger than the angle θ1 of the side faces of the conductive oxide layer, this makes it less likely that the necessary portion, namely, the dielectric layer covering the ridge side faces, will be etched by the dry etching, and therefore the dielectric layer 24 can be formed in a state in which the entire side faces of the ridge are covered by the dielectric layer 24, and the upper face and side faces of the conductive oxide layer 20 are exposed from the dielectric layer 24.

Then, a second protective film 25 is formed in a region that is about 35 μm away from the ridge side faces on the ridge bottom face region 40. This second protective film 25 covers all the way to the side faces of the semiconductor layer.

After this, as shown in FIG. 4i, a metal layer 22 is formed as a p-side pad electrode over the conductive oxide layer 20 and the dielectric layer 24. An n-side electrode 26 is formed on the rear face of the substrate 10. A dielectric film composed of $Al_2O_3$ is formed at the front cavity plane of the semiconductor layer. Also, a dielectric multilayer film composed of $ZrO_2$ and $SiO_2$ is formed at the rear cavity plane of the semiconductor layer. The above procedure allows a semiconductor laser element to be formed.

Thus, with the semiconductor laser element in Example 1, electrical resistivity can be reduced by providing the sloped parts 32 to the conductive oxide layer in a state in which a large surface area is ensured on the side of the conductive oxide layer that contacts with the semiconductor layer. Also, a larger contact surface area between the metal layer 22 and the conductive oxide layer 20 helps to lower the operating voltage, and this markedly improves the power efficiency.

Furthermore, with this manufacturing process, the dielectric layer 24 can be formed with good accuracy at just the required location, so a semiconductor laser element with more stable characteristics can be manufactured.

Example 2

A semiconductor laser element is produced in the same manner as in Example 1, except that the composition of the well layer of the active layer 14 is changed to $In_{0.22}Ga_{0.78}N$, the oscillation wavelength to 510 nm, and the ridge width to 5 μm. Even in a longer wavelength band, the occurrence of cracking can be suppressed. Otherwise, the same effects as in Example 1 are obtained.

Example 3

A semiconductor laser element is produced in the same manner as in Example 1, except that the composition of the second p-type semiconductor layer is changed to GaN from AlGaN, and the composition of the well layer of the active layer 14 is changed to $In_{0.05}Ga_{0.95}N$, the oscillation wavelength to 405 nm, and the ridge width to 1.5 μm. Even in a longer wavelength band, the occurrence of cracking can be suppressed. The same effects as in Example 1 are obtained.

Example 4

A semiconductor laser element is produced in the same manner as in Example 1, except that θ1 is 76°, θ2 is 84°. The same effects as in Example 1 are obtained.

Example 5

A semiconductor laser element is produced in the same manner as in Example 1, except that the conductive oxide layer is formed of IZO. The same effects as in Example 1 are obtained.

Example 6

A semiconductor laser element is produced in the same manner as in Example 1, except that the plane orientation of the substrate is changed to plane (20-21), and the composition of the second p-type semiconductor layer is changed to GaN from AlGaN. The same effects as in Example 1 are obtained.

Example 7

A semiconductor laser element is produced in the same manner as in Example 1, except that the composition of the second p-type semiconductor layer is changed to superlattice formed of InGaN and GaN, and the composition of the well layer of the active layer 14 is changed to $In_{0.2}Ga_{0.8}N$, the oscillation wavelength to 473 nm, and the ridge width to 2.5 μm. The same effects as in Example 1 are obtained.

Example 8

A semiconductor laser element is produced in the same manner as in Example 1, except that the plane orientation of the substrate is changed to plane (10-1-1), and the composition of the second p-type semiconductor layer is changed to GaN from AlGaN. The same effects as in Example 1 are obtained.

Example 9

A semiconductor laser element is produced in the same manner as in Example 1, except that the plane orientation of the substrate is changed to plane (10-1-2), and the composition of the second p-type semiconductor layer is changed to GaN from AlGaN. The same effects as in Example 1 are obtained.

Example 10

A semiconductor laser element is produced in the same manner as in Example 1, except that the plane orientation of the substrate is changed to plane (11-22), and the composition of the second p-type semiconductor layer is changed to GaN from AlGaN. The same effects as in Example 1 are obtained.

Example 11

The semiconductor laser element of Example 1 is formed by the following manufacturing method.

First, as shown in FIG. 6A, just as in the manufacturing method of Example 1, the n-side semiconductor layer 12, the active layer 14, and the p-side semiconductor layer 16 are laminated in that order over the GaN substrate 10 to form the semiconductor layer 50.

The conductive oxide layer 51 is formed over the semiconductor layer 50. An ITO film is formed as this conductive oxide layer 51 using a sputtering apparatus. The thickness d1 of the conductive oxide layer 51 (see FIG. 2) is 400 nm.

Then, as shown in FIG. 6B, as in Example 1, an $SiO_2$ film is formed in a thickness of 500 nm as the mask layer 52 with a CVD apparatus over substantially the entire surface of the conductive oxide layer 51. After this, a pattern is formed with the width of the mask layer 52 being 15.0 μm by etching with an RIE apparatus.

This mask layer 52 is used to etch the conductive oxide layer 51. The etching here is performed with an RIE apparatus in which iodine is used as the etching gas, for example. The conductive oxide layer 51 patterned here is such that its side faces are formed in a tapered shape by the action of anisotropic etching and the recession of the mask layer 52 as discussed above. That is, the width a1 of the upper face of the conductive oxide layer 51 is 13.0 μm, the width b1 of the lower face is 15.0 μm, the angle θ1 of the side faces of the semiconductor layer 50 with respect to the upper face is 63°, and the inclination angle θ1' is 27°.

As shown in FIG. 6C, part of the second conductivity type semiconductor layer is removed using the mask layer 52 and the conductive oxide layer 51. This removal is accomplished by using an RIE apparatus to etch the semiconductor layer 50, forming a stripe-shaped ridge with a width of about 15.0 μm and a height of about 0.45 μm. The angle θ2 of the ridge side faces here is 78°, the inclination angle θ2' is 12°, and the relation θ1<θ2 and θ1'>θ2' is satisfied.

As shown in FIG. 6D, the dielectric layer 53 is formed over the semiconductor layer 50 including the ridge, while the mask layer 52 is left in place. This dielectric layer 53 is formed by an $SiO_2$ film in a thickness of 200 nm using a sputtering apparatus. This covers the upper face and side faces of the mask layer 52, the sloped faces of the conductive oxide layer 51, and the ridge side faces from the ridge bottom face region.

As shown in FIG. 6E, the mask layer 52 is removed to expose the surface of the conductive oxide layer 51 on the ridge. This removal of the mask layer 52 is accomplished by lift-off using a peeling solution, just as in Example 1. Simultaneously with the removal of the mask layer 52, not only is it peeled from the upper face of the conductive oxide layer 51, but also the side faces can be peeled from the dielectric layer 53, whereas at the side faces of the ridge, peeling of the dielectric layer 53 is prevented, and this layer remains adhering.

After this, as shown in FIG. 6F, as in Example 1, a metal layer 54 is formed as a p-side pad electrode over at least the dielectric layer 53 and the upper face of the conductive oxide layer 51. Also, an n-side electrode is formed on the rear face of the substrate. A dielectric film composed of $Al_2O_3$ is formed on the front cavity plane of the semiconductor layer, and a dielectric multilayer film composed of $ZrO_2$ and $SiO_2$ is formed on the rear cavity plane, which yields a semiconductor laser element.

Thus, a semiconductor laser element that is the same as that in Example 1 can also be obtained with a method that differs from the manufacturing method of Example 1. With this semiconductor laser element, since the side faces of the conductive oxide layer are sloped in a state in which a large surface area is ensured on the side of the conductive oxide layer that touches the semiconductor layer, the electrical resistivity can be reduced. Also, the contact surface area between the metal layer 54 and the conductive oxide layer 51 can be increased, the operating voltage can be lowered, and power efficiency can be markedly improved.

Furthermore, since the dielectric layer 53 can be accurately formed with this manufacturing process, a semiconductor laser element with stable characteristics can be manufactured.

INDUSTRIAL APPLICABILITY

The semiconductor laser element of the present invention can be utilized in all devices, such as optical disks, optical communications systems, projectors, printers, measurement devices, and so forth.

What is claimed is:

1. A semiconductor laser element comprising;
   a substrate,
   a semiconductor layer laminated a first conductivity type semiconductor layer, an active layer and a second conductivity type semiconductor layer in that order on the substrate,
   a stripe-like ridge formed on an upper face of the second conductivity type semiconductor layer,
   a conductive oxide layer formed on the upper face of the ridge,
   a dielectric layer, with a refractive index that is lower than a refractive index of the semiconductor layer, formed on the side faces of the ridge, and
   a metal layer formed so as to cover the conductive oxide layer and the dielectric layer,
   a surface of the conductive oxide layer is exposed from the dielectric layer, and the side faces of the conductive oxide layer are sloped with respect to the upper face of the ridge, and
   an inclination angle of the side faces of the conductive oxide layer with respect to a normal direction is greater than an inclination angle of the side faces of the ridge with respect to a normal direction.

2. The semiconductor laser element comprising according to claim 1, wherein
   the refractive index of the conductive oxide layer is lower than the refractive index of the semiconductor layer.

3. The semiconductor laser element comprising according to claim 1, wherein $d2/d1>(b2-a2)/(b1-a1)$ is satisfied, when d1 is the height of the conductive oxide layer, d2 is the height of the ridge, a1 is the width of the upper face of the conductive oxide layer, b1 is the width of the lower face of the conductive oxide layer, a2 is the width of the upper face of the ridge, and b2 is the width of the lower face of the ridge.

4. The semiconductor laser element comprising according to claim 1, wherein
   d1 is 50 angstrom or more, and d1<a1 is satisfied, when the height of the conductive oxide layer is d1 and the width of the upper face is a1.

5. The semiconductor laser element comprising according to claim 1, wherein
   the height d2 of the ridge is 6000 angstrom or less.

6. The semiconductor laser element comprising according to claim 1, wherein
   the semiconductor laser element is a nitride semiconductor laser element, and
   the oscillation wavelength is 440 nm or more.

7. The semiconductor laser element comprising according to claim 1, wherein
   the conductive oxide layer is ITO.

8. The semiconductor laser element comprising according to claim 1, wherein
the active layer contains indium,
the second conductivity type semiconductor layer has a layer formed from $In_xAl_yGa_{1-x-y}N$ ($0 \leq x$, $0 \leq y$, $0 \leq x+y \leq 1$), and
a layer that contacts with the conductive oxide layer is GaN.

9. The semiconductor laser element comprising according to claim 1, wherein
the second conductivity type semiconductor layer has a layer containing aluminum, and
the thickness of the layer containing aluminum is 6000 angstrom or less.

* * * * *